United States Patent
Ashikaga

(10) Patent No.: US 7,078,288 B2
(45) Date of Patent: Jul. 18, 2006

(54) METHOD OF PRODUCING FERROELECTRIC CAPACITOR

(75) Inventor: Kinya Ashikaga, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/105,505

(22) Filed: Apr. 14, 2005

(65) Prior Publication Data
US 2006/0046316 A1    Mar. 2, 2006

(30) Foreign Application Priority Data
Aug. 24, 2004    (JP) .............................. 2004-243520

(51) Int. Cl.
*H01L 21/8242* (2006.01)
(52) U.S. Cl. .......................................... 438/240; 438/3
(58) Field of Classification Search .................. 438/3, 438/240
See application file for complete search history.

(56) References Cited

U.S. PATENT DOCUMENTS

| 5,374,578 A | 12/1994 | Patel et al. | |
|---|---|---|---|
| 5,525,528 A | 6/1996 | Perino et al. | |
| 6,022,774 A * | 2/2000 | Kawai et al. | 438/240 |
| 6,100,201 A | 8/2000 | Maejima et al. | |
| 2003/0203511 A1 | 10/2003 | Ashikaga | |

FOREIGN PATENT DOCUMENTS

| JP | 06-013565 | 1/1994 |
|---|---|---|
| JP | 08-008409 | 1/1996 |
| JP | 10-247724 | 9/1998 |
| JP | 2003-324186 | 11/2003 |

* cited by examiner

*Primary Examiner*—Jack Chen
(74) *Attorney, Agent, or Firm*—Takeuchi&Kubotera,LLP

(57) ABSTRACT

A method of producing a ferroelectric capacitor includes forming a first insulating layer on a semiconductor substrate with an MOSFET. After a first interlayer insulating layer is formed, a first conductive layer, a ferroelectric layer, and a second conductive layer are laminated on the first interlayer insulating layer to form a ferroelectric capacitor. After a first opening is formed in a ferroelectric thin layer, first restoration annealing is performed relative to a first member formed of a first interlayer insulating layer and the ferroelectric capacitor. A second interlayer insulating layer is formed on the first interlayer insulating layer, and a second opening is formed in the second interlayer insulating layer through etching. Then, second restoration annealing is performed relative to a second member formed of the first member and the second interlayer insulating layer with the second opening under in an order of nitrogen, oxygen, and nitrogen, respectively.

2 Claims, 4 Drawing Sheets

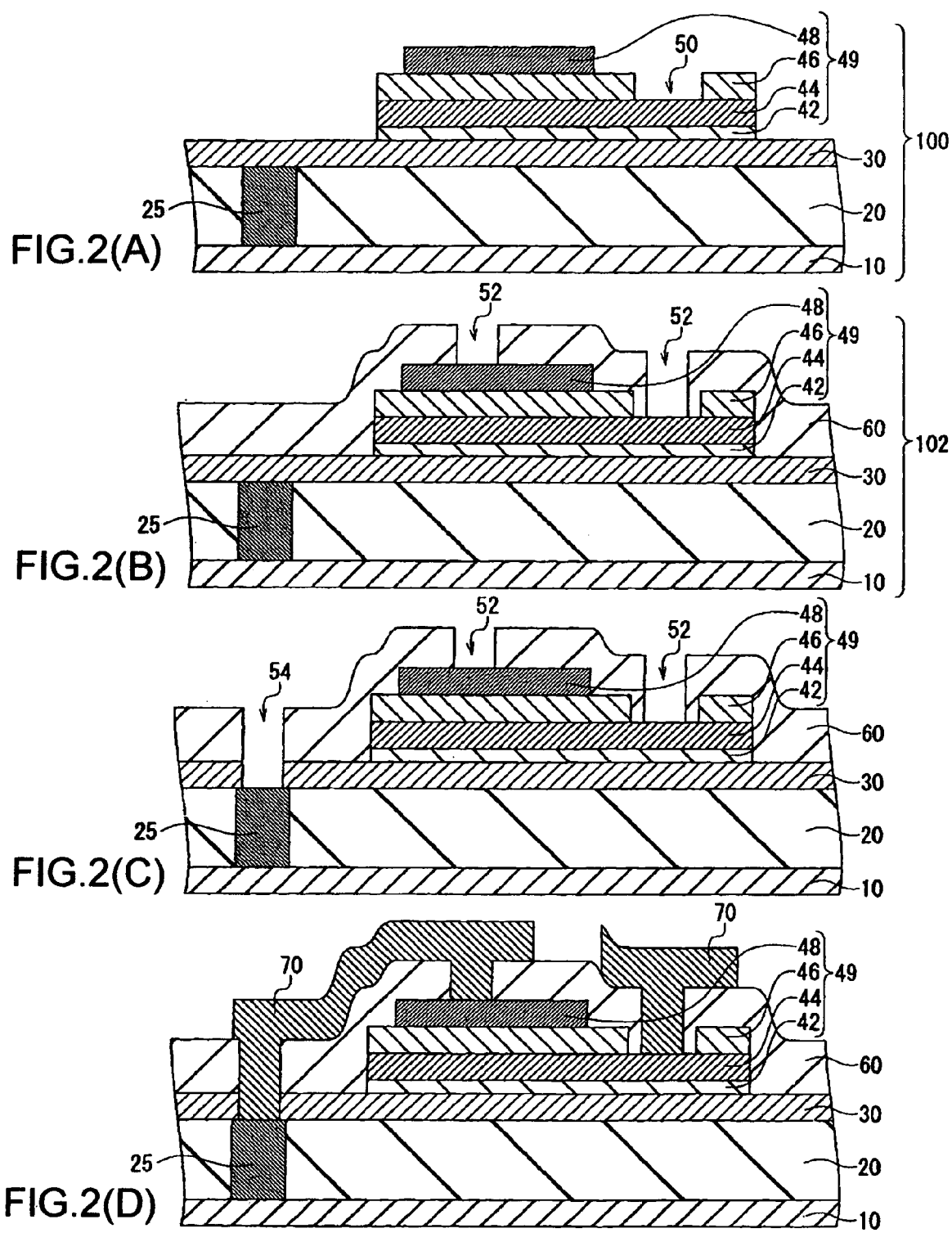

METHOD OF PRODUCING FERROELECTRIC CAPACITOR

BACKGROUND OF THE INVENTION AND RELATED ART STATEMENT

The present invention relates to a method of producing a ferroelectric memory, in particular, a non-volatile memory using a ferroelectric capacitor.

Recently, a semiconductor memory (ferroelectric memory) using a ferroelectric capacitor has been focused on as a non-volatile memory. A ferroelectric has a characteristic of holding a bi-polar in a voltage application direction even after a voltage is removed (self-polarization). Accordingly, the ferroelectric memory can be applied as a non-volatile memory. The ferroelectric switches polarization thereof at a rate of an order of nano-second. It is also possible to decrease a voltage for switching polarization of the ferroelectric about 2.0 V through optimization of a manufacturing method of a ferroelectric layer. For these reasons, as compared with a flash memory or an EEPROM (Electrically Erasable Programmable Read-Only Memory), the ferroelectric memory has significant advantages in terms of a re-writing speed and an operation voltage. Further, it is possible to re-write data in the ferroelectric memory more than $10^{12}$ times. The ferroelectric capacitor has been commercially available as an RAM (Random Access Memory).

In the ferroelectric memory, it is necessary to reduce deterioration due to imprint for obtaining long term reliability. The imprint is a phenomenon in which, after data is stored in the ferroelectric memory and is held therein for a long period of time, a characteristic of holding data opposite to the stored data is deteriorated. When certain data is held in the ferroelectric memory, floating electron charges in the ferroelectric capacitor are re-distributed to form an internal electric field aligned in a direction of polarization, thereby causing the imprint.

The imprint is associated with and influenced by floating electron charges in a ferroelectric layer of the ferroelectric capacitor. Further, the imprint is influenced by deformation (damage) of crystal cause by hydrogen entering the ferroelectric layer during a manufacturing process after the ferroelectric capacitor is formed. Accordingly, it is necessary to provide a step for preventing the damage in the ferroelectric layer in the manufacturing process after the ferroelectric capacitor is formed.

For example, a step has been performed in which a cover layer such as $Al_2O_3$ is formed right after a ferroelectric capacitor is formed, so that hydrogen does not reach the ferroelectric layer, thereby preventing damage. In such a step, it is necessary to form the cover layer in the additional step, thereby making a manufacturing process complex.

As another example, restoration annealing has been performed for improving ferroelectric characteristic of a ferroelectric capacitor (see Patent References 1 to 4). After the ferroelectric capacitor is formed, a contact hole is formed through etching for contacting an electrode of the ferroelectric capacitor. During the etching, the ferroelectric capacitor may be damaged by hydrogen entering when an oxide layer is formed as an interlayer insulating layer. Accordingly, in Patent Reference 1, the restoration annealing is performed under oxygen for restoring the damage. Such restoration annealing may be performed under ozone (Patent Reference 2), nitrogen (Patent Reference 3), or atmosphere (Patent Reference 4). Patent Reference 1; Japanese Patent Publication (Kokai) No. 10-247724

Patent Reference 2; Japanese Patent Publication (Kokai) No. 06-13565

Patent Reference 3; Japanese Patent Publication (Kokai) No. 08-8409

Patent Reference 3; Japanese Patent Publication (Kokai) No. 2003-324186

When the restoration annealing is performed in the conventional method, crystallinity of a damaged portion is restored, so that the damaged portion can function as a ferroelectric. However, it is difficult to completely restore the damaged portion, and the damaged portion still includes floating electron charges. When an electric field is applied between electrodes of the ferroelectric capacitor to align polarization, the floating electron charges move toward the electrodes, thereby creating an internal electrical field and shifting hysteresis.

In view of the problems described above, an object of the present invention is to provide a method of producing a ferroelectric memory having a small shift of hysteresis even when a ferroelectric capacitor contains floating electron charges.

Further objects and advantages of the invention will be apparent from the following description of the invention.

SUMMARY OF THE INVENTION

In order to attain the objects described above, according to the present invention, a method of producing a ferroelectric capacitor includes the steps of preparing a semiconductor substrate having an MOSFET; and forming a first interlayer insulating layer on the semiconductor substrate. Then, a first conductive layer, a ferroelectric layer, and a second conductive layer are sequentially laminated on the first interlayer insulating layer to form a capacitor forming laminated layer. The second conductive layer is processed to form an upper electrode. Then, the first conductive layer and the ferroelectric layer are processed sequentially to form a ferroelectric thin layer and an upper electrode, respectively, so that a ferroelectric capacitor is formed from the capacitor forming laminated layer.

In the next step, after a first opening is formed in the ferroelectric thin layer for contacting the lower electrode, first restoration annealing is performed relative to a first member formed of the first interlayer insulating layer and the ferroelectric capacitor with the first opening. Then, a second interlayer insulating layer is formed on the first interlayer insulating layer for covering the ferroelectric capacitor, and a second opening is formed in the second interlayer insulating layer through etching. Then, second restoration annealing is performed relative to a second member formed of the first member and the second interlayer insulating layer with the second opening under, in an order of, nitrogen, oxygen, and nitrogen, respectively.

In the present invention, the second restoration annealing is performed relative to the ferroelectric thin layer under, in the order of, nitrogen, oxygen, and nitrogen, respectively. Accordingly, it is possible to suppress restoration of a crystal structure of the ferroelectric thin layer, and fix a damage portion to a normal dielectric state. When the damaged portion is fixed to the normal dielectric state, even if an electric field is applied between electrodes of the capacitor to align the polarization direction, dipoles in a normal dielectric area are not inverted, so that no floating electron charges move. Accordingly, an apparent polarization value decreases depending on a size of the normal dielectric area, and long term stability of the ferroelectric capacitor is obtained.

BRIEF DESCRIPTION OF THE DRAWINGS

FIGS. 2(A) to 2(D) are explanatory views showing a method of producing a ferroelectric memory (No. 2) according to the embodiment of the present invention;

DETAILED DESCRIPTION OF PREFERRED EMBODIMENTS

Figure 1A:
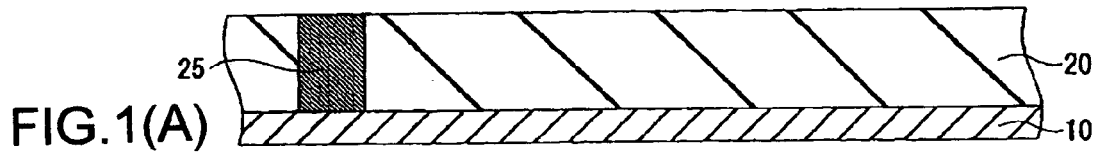
FIGS. 1(A) to 1(D) are explanatory views showing a method of producing a ferroelectric memory (No. 1) according to an embodiment of the present invention.
Figure 1B:
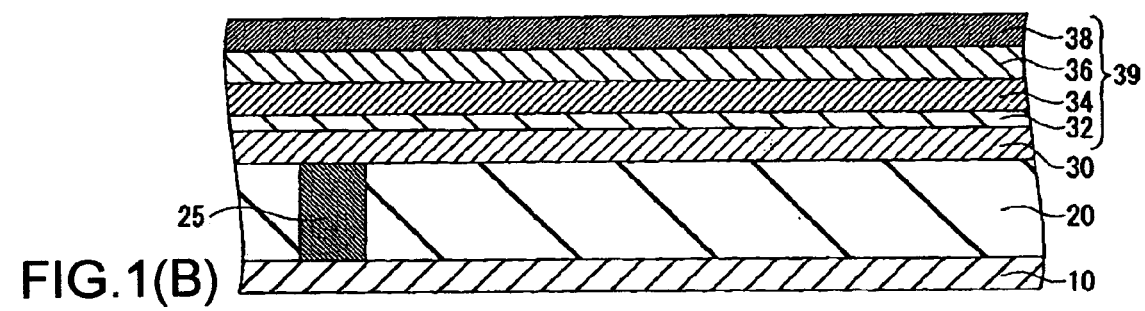
Figure 1C:
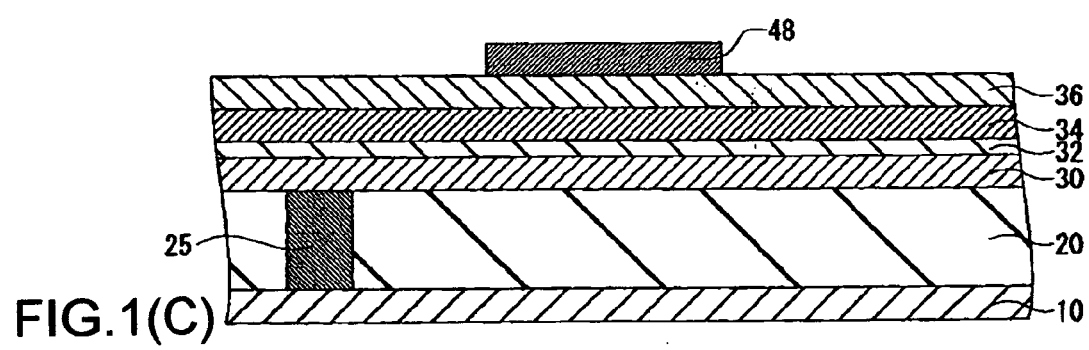
Figure 1D:
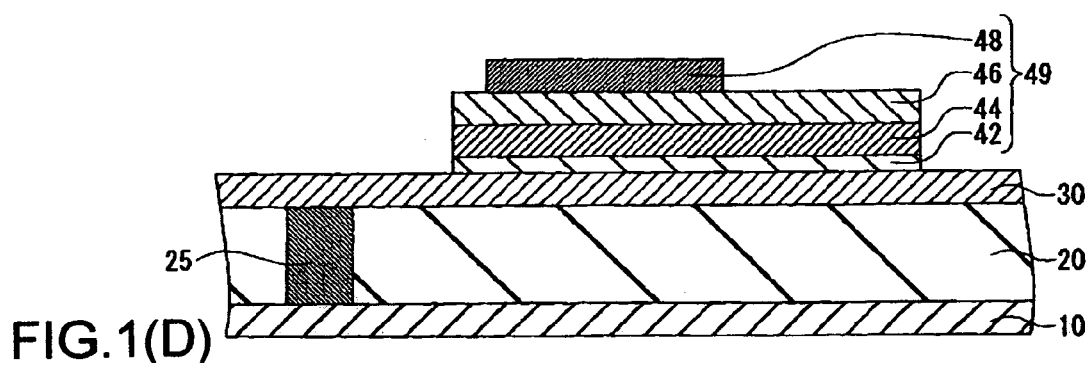

Hereunder, embodiments of the present invention will be explained with reference to the accompanying drawings. A configuration and arrangement of an embodiment are schematically presented for explaining the invention. The embodiments will be explained with configurations and numerical conditions as preferred examples, and the invention is not limited thereto.

FIGS. 1(A)–1(D) and 2(A)–2(D) are explanatory sectional views showing the method of producing a ferroelectric capacitor according to the embodiment of the present invention.

In the method, first, a semiconductor substrate 10 with an MOSFET is prepared. Then, a first interlayer insulating layer 20 is deposited on the semiconductor substrate 10. The first interlayer insulating layer 20 is etched with photolithography and dry etching, so that a contact hole is formed for connecting a gate, drain, or source of the MOSFET. The contact hole is filled with tungsten to form a conductive plug 25. Then, a surface of the first interlayer insulating layer 20 is flattened with a CMP (chemical mechanical polishing) method (see FIG. 1(A)). In the drawings, the MOSFET is not shown, and a single conductive plug is shown.

In the next step, an oxidation protection layer 30 is formed on the first insulating layer 20. Then, a contact layer 32, a first conductive layer 34, a ferroelectric layer 36, and a second conductive layer 38 are sequentially laminated on the oxidation protection layer 30 to form a capacitor forming laminated layer 39. The oxidation protection layer 30 may be formed of a lamination of silicon oxide and silicon nitride with a known plasma CVD method. The contact layer 32 formed of tantalum oxide ($TaO_x$) is formed on the oxidation protection layer 30 with a sputtering method. The contact layer 32 is provided for closely contacting the oxidation protection layer 30 with a lower electrode of a ferroelectric capacitor (described below), and functions as a foundation layer of the lower electrode. The first conductive layer 34 formed of platinum is formed on the contact layer 32 with the sputtering method.

The ferroelectric layer 36 formed of, for example, $SrBi_2Ta_2O_9$ is formed on the first conductive layer 34 through an application with a known spin coating method and crystallization with annealing. Similar to the first conductive layer 34, the second conductive layer 38 formed of platinum is formed on the ferroelectric layer 36 with the sputtering method (see FIG. 1(B)). Then, the second conductive layer 38 is processed with appropriate photolithography and dry etching to form an upper electrode 48.

In the next step, the ferroelectric layer 36 and the first conductive layer 34 are sequentially processed with appropriate photolithography and dry etching to form a ferroelectric thin layer 46 and a lower electrode 44, respectively. The process is performed in a single dry etching step. Accordingly, the lower electrode 44 is self-aligned and formed with the ferroelectric thin layer 46 as a mask. During the process, the contact layer 32 is processed to become a foundation layer 42 of the lower electrode 44. Accordingly, the capacitor forming laminated layer 39 is processed to form a ferroelectric capacitor 49 formed of the upper electrode 48, the ferroelectric thin layer 46, the lower electrode 44, and the foundation layer 42 (see FIG. 1(D)).

In the next step, a first opening 50 is formed in the ferroelectric thin layer 46 for contacting the lower electrode 44 with appropriate photolithography and dry etching (see FIG. 2(A)). The first opening 50 is formed at a position away from the upper electrode 48. In FIG. 2(A), a member formed of the first interlayer insulating layer 20 and the ferroelectric capacitor 49 with the first opening 50 is designated as a first member 100.

Due to the etching for forming the ferroelectric capacitor 49 and forming the first opening 50 in the ferroelectric thin layer 46, a part of the ferroelectric thin layer 46 contains a damaged crystal structure. Accordingly, the ferroelectric thin layer 46 is processed in first restoration annealing for restoring the damaged crystal structure. The first restoration annealing preferably includes thermal treatment similar to the annealing for crystallization of the ferroelectric layer 36. In this embodiment, the first member 100 shown in FIG. 2(A) is thermally treated under oxygen at 750° C. for 30 minutes.

In the next step, a second interlayer insulating layer 60 is formed on a whole upper surface of the oxidation protection layer 30 for covering the ferroelectric capacitor 49. The second interlayer insulating layer 60 is formed of a silicon oxide layer with plasma CVD (Chemical Vapor Deposition) using TEOD (tetra-ethyl-ortho-silicate). Then, a second opening 52 is formed in the second interlayer insulating layer 60 for connecting the upper electrode 48 and the lower electrode 44 of the ferroelectric capacitor 49 to an external wiring with the photolithography and dry etching (see FIG. 2(B)). In FIG. 2(B), a member formed of the first member 100 and the second interlayer insulating layer 60 with the second opening 52 is designated as a second member 102.

Figure 3A:
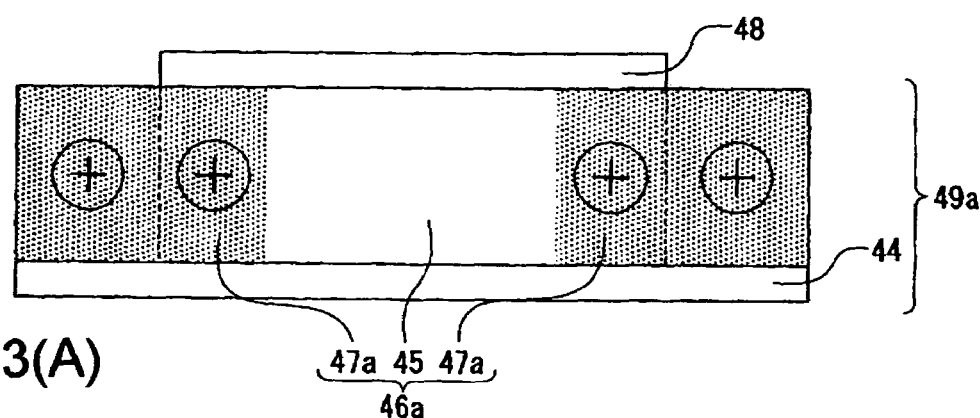
FIGS. 3(A) and 3(B) are schematic sectional views of a ferroelectric capacitor for explaining second restoration annealing.
Figure 3B:
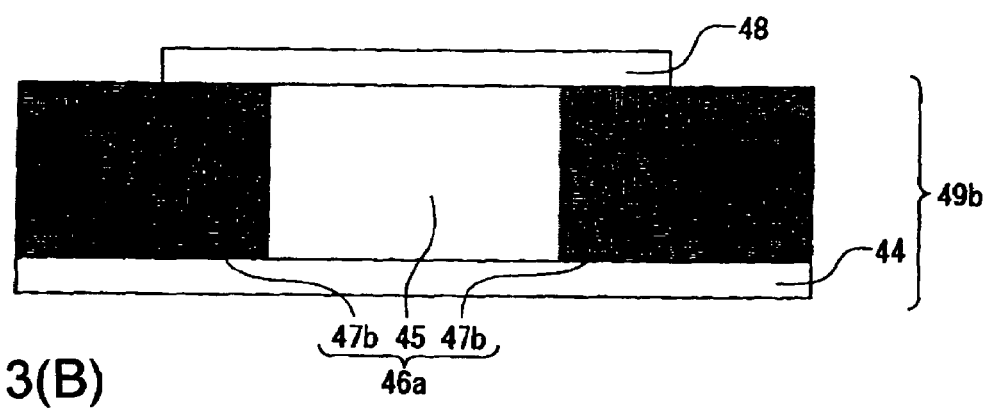

When the second interlayer insulating layer 60 and the second opening 52 are formed, a part of the ferroelectric thin layer 46 contains damage in a crystal structure thereof. Accordingly, the ferroelectric thin layer 46 is processed in second restoration annealing for restoring the damaged crystal structure. With reference to FIGS. 3(A) and 3(B), the second restoration annealing will be explained. FIGS. 3(A) and 3(B) are schematic sectional views of the ferroelectric capacitor 49 for explaining the second restoration annealing. FIG. 3(A) shows a ferroelectric capacitor 49a before the second restoration annealing, and FIG. 3(A) shows a ferroelectric capacitor 49b after the second restoration annealing.

Before the second restoration annealing, a portion of the ferroelectric capacitor 49a is exposed during the etching, and becomes a damaged portion 47a. The damaged portion 47a is an area modified during the etching for forming the ferroelectric capacitor 49a. A crystal structure of the damaged portion 47a is somewhat restored during the first restoration annealing. However, the damaged portion 47a still contains a large number of damaged sites such as oxygen deficiency as compared with an internal area 45 in which no modification occurs. When the second interlayer insulating layer 60 is formed on the ferroelectric capacitor 49a with the plasma CVD using TEOD, the crystal structure of the damaged portion 47a is further deteriorated due to hydrogen generated upon forming the silicon oxide layer (see FIG. 3(A)).

In the second restoration annealing, first, a thermal process chamber is set at a specific annealing temperature. The annealing temperature is usually set between 650° C. and 750° C., and set at 700° C. in the embodiment. Nitrogen gas ($N_2$) is introduced in the thermal process chamber, and the second member 102 with the ferroelectric capacitor is placed in the thermal process chamber. Under nitrogen gas, restoration of a crystal structure of a ferroelectric layer 46a is suppressed when the substrate is heated. When the second member 102 is completely placed in the thermal process chamber, nitrogen gas is switched to oxygen gas. Then, the second member 102 is thermally processed in the thermal process chamber for 30 minutes to one hour.

Then, oxygen gas is switched to nitrogen gas, and the thermal process chamber is cooled. After the second member 102 is sufficiently cooled, the second member 102 is removed from the thermal process chamber. Similar to placing the second member 102 in the thermal process chamber, when the second member 102 is cooled, nitrogen gas is introduced, thereby suppressing the restoration of the crystal structure of the ferroelectric layer 46a. Further, when the second member 102 is thermally processed under nitrogen gas, the damaged portion (47a in FIG. 3(A)) is fixed to a normal dielectric state, and becomes a normal dielectric area 47b (see FIG. 3(B)).

When the damaged portion is fixed to the normal dielectric state, even if an electric field is applied between electrodes of a capacitor to align the polarization direction, dipoles in the normal dielectric area 47b are not inverted, so that no floating electron charges move. Accordingly, an internal electrical filed due to the floating electron charges is reduced, thereby reducing a shift of hysteresis. As a result, depending on a size of the normal dielectric area 47b, an apparent polarization value decreases and long term stability is obtained.

Figure 4:
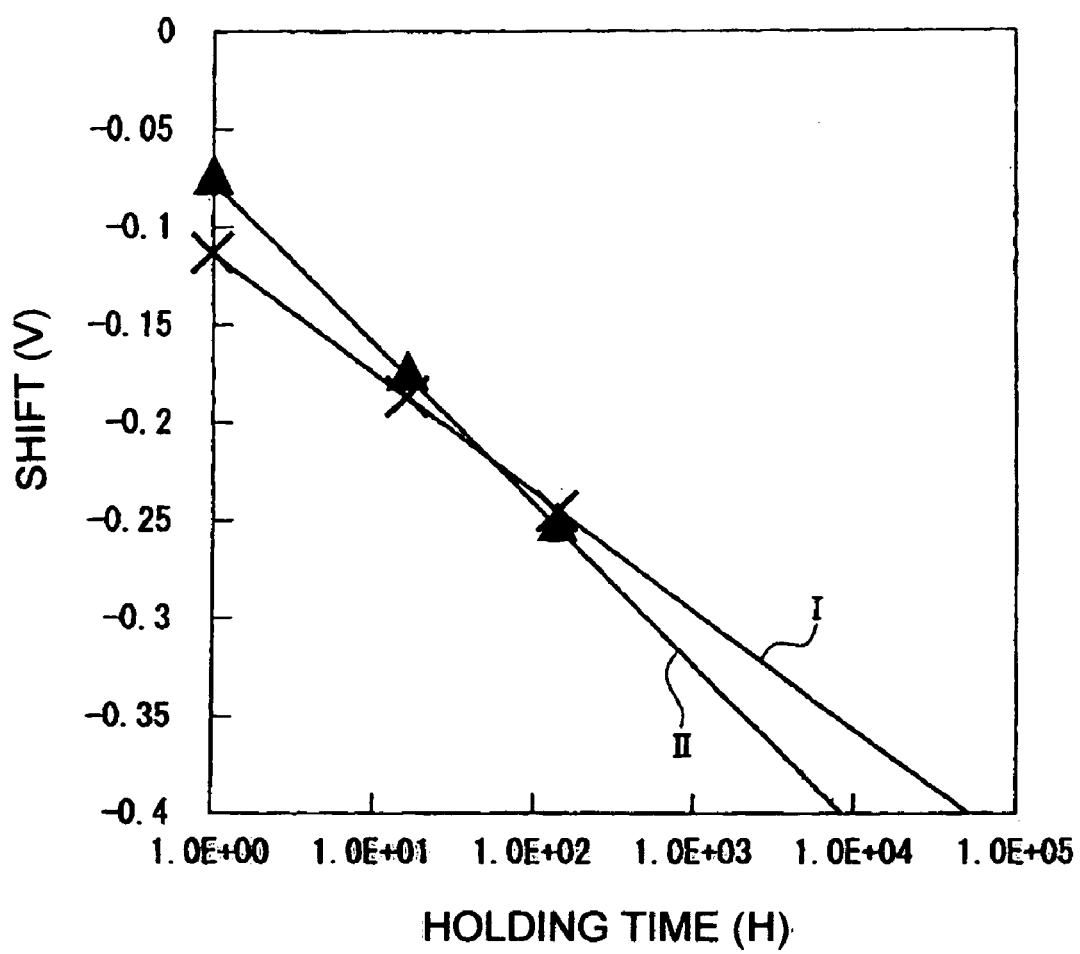
FIG. 4 is a chart showing a difference in deterioration between the ferroelectric capacitor of the present invention and a conventional ferroelectric capacitor.

FIG. 4 is a chart showing a difference in deterioration between the ferroelectric capacitor annealed according to the embodiment of the present invention and a ferroelectric capacitor annealed through a conventional method. The vertical axis represents a voltage shift of a hysteresis curve, and the horizontal axis represents a high temperature holding time. A line I represents a voltage shift of the ferroelectric capacitor annealed according to the embodiment of the present invention, and a line II represents a voltage shift of the ferroelectric capacitor annealed through the conventional method. In the conventional method, when the second member 102 is placed in the thermal process chamber and the second member 102 is cooled, oxygen is introduced.

In the case of the ferroelectric capacitor annealed through the conventional method, the voltage shift (line II) is about −0.07 V at the high temperature holding time of 1 hour. On the other hand, in the case of the ferroelectric capacitor annealed according to the embodiment of the present invention, the voltage shift is about −0.17 V at the same high temperature holding time, which is larger than that in the conventional method. The result is attributed to the fact that the damaged portion (47a in FIG. 3(A)) is fixed to the normal dielectric state, thereby reducing the apparent polarization value.

At the high temperature holding time of 140 hours, the voltage shift is about −0.25 V both in the embodiment and the conventional method. That is, the voltage shift (line I) in the embodiment of the present invention has a slope smaller than that in the conventional method (line II). Accordingly, at a large holding time, the ferroelectric capacitor annealed according to the embodiment of the present invention has less deterioration.

After the second restoration annealing, a third opening 54 is provided with the photolithography and dry etching for connecting the conductive plug to an external wiring (see FIG. 2(C)). When the third opening 54 is formed, tungsten is exposed. Accordingly, it is difficult to process the device at a high temperature under oxygen afterward. Then, a metal layer (not shown) is formed inside the second and third openings 52 and 54 and on the second interlayer insulating layer 60. The metal layer is processed with the photolithography and dry etching to form a metal wiring 70 (see FIG. 2(D)).

The disclosure of Japanese Patent Application, No. 2004-243520, filed on Aug. 24, 2004, is incorporated in the application.

While the invention has been explained with reference to the specific embodiments of the invention, the explanation is illustrative and the invention is limited only by the appended claims.

What is claimed is:

1. A method of producing a ferroelectric capacitor, comprising:

preparing a semiconductor substrate having an MOSFET;

forming a first interlayer insulating layer on the semiconductor substrate;

laminating sequentially a first conductive layer, a ferroelectric layer, and a second conductive layer on the first interlayer insulating layer to form a capacitor forming laminated layer;

processing the second conductive layer to form an upper electrode, processing sequentially the ferroelectric layer and the first conductive layer to form a ferroelectric thin layer and an lower electrode, respectively so that a ferroelectric capacitor is formed from the capacitor forming laminated layer, forming a first opening in the ferroelectric thin layer for contacting the lower electrode, performing first restoration annealing relative to a first member formed of the first interlayer insulating layer and the ferroelectric capacitor with the first opening, forming a second interlayer insulating layer on the first interlayer insulating layer for covering the ferroelectric capacitor, forming a second opening in the second interlayer insulating layer through etching, and performing second restoration annealing relative to a second member formed of the first member and the second interlayer insulating layer with the second opening under, in an order of, nitrogen, oxygen, and nitrogen, respectively.

2. A method according to claim 1, wherein said second annealing includes:

placing the second member in a thermal process chamber at a temperature between 650° C. and 750° C. while introducing nitrogen gas in the thermal process chamber, switching nitrogen gas in the thermal process chamber to oxygen gas, holding the second member in the thermal process chamber for 30 minutes to one hour under oxygen gas, switching oxygen gas in the thermal process chamber to nitrogen gas, and cooling the thermal process chamber.

* * * * *